US 12,242,346 B2

(12) United States Patent
Wieduwilt et al.

(10) Patent No.: US 12,242,346 B2
(45) Date of Patent: Mar. 4, 2025

(54) GLOBAL COLUMN REPAIR WITH LOCAL COLUMN DECODER CIRCUITRY, AND RELATED APPARATUSES, METHODS, AND COMPUTING SYSTEMS

(71) Applicant: Micron Technology, Inc., Boise, ID (US)

(72) Inventors: Christopher G. Wieduwilt, Boise, ID (US); Fatma Arzum Simsek-Ege, Boise, ID (US)

(73) Assignee: Micron Technology, Inc., Boise, ID (US)

(*) Notice: Subject to any disclaimer, the term of this patent is extended or adjusted under 35 U.S.C. 154(b) by 105 days.

(21) Appl. No.: 17/937,924

(22) Filed: Oct. 4, 2022

(65) Prior Publication Data

US 2024/0111628 A1 Apr. 4, 2024

(51) Int. Cl.
*G06F 11/10* (2006.01)
*G11C 29/00* (2006.01)

(52) U.S. Cl.
CPC ........ *G06F 11/1092* (2013.01); *G11C 29/702* (2013.01); *G11C 29/76* (2013.01); *G11C 29/78* (2013.01)

(58) Field of Classification Search
CPC ... G06F 11/1092; G11C 29/702; G11C 29/76; G11C 29/78
USPC .......................................................... 714/711
See application file for complete search history.

(56) References Cited

U.S. PATENT DOCUMENTS

| 6,910,152 B2 * | 6/2005 | Blodgett | G11C 29/846 711/134 |
| 8,086,913 B2 * | 12/2011 | Houg | G11C 29/78 714/710 |
| 10,803,974 B1 * | 10/2020 | Tang | G11C 29/76 |
| 2001/0044916 A1 * | 11/2001 | Blodgett | G11C 29/808 714/711 |

(Continued)

OTHER PUBLICATIONS

He et al., "Microelectronic Devices Including Control Logic Circuitry Overlying Memory Arrays, and Related Memory Devices and Electronic Systems", Filed Aug. 29, 2022, U.S. Appl. No. 17/898,150, 47 pages.

(Continued)

*Primary Examiner* — James C Kerveros
(74) *Attorney, Agent, or Firm* — TraskBritt (57) ABSTRACT

Global column repair with local column decoder circuitry and related apparatuses, methods, and computing systems are disclosed. An apparatus includes global column repair circuitry including column address drivers corresponding to respective ones of column planes of a memory array. The column address drivers are configured to, if enabled, drive a received column address signal to local column decoder circuitry local to respective ones of the column planes. The global column repair circuitry also includes match circuitry and data storage elements configured to store defective column addresses corresponding to defective column planes. The match circuitry is configured to compare a received column address indicated by the received column address signal to the defective column addresses and disable a column address driver corresponding to a defective column plane responsive to a determination that the received column address matches a defective column address associated with the defective column plane.

24 Claims, 5 Drawing Sheets

(56) References Cited

U.S. PATENT DOCUMENTS

| | | | |
|---|---|---|---|
| 2002/0019961 A1* | 2/2002 | Blodgett | G11C 29/846 714/718 |
| 2009/0316474 A1* | 12/2009 | Cho | G11C 29/808 365/163 |
| 2019/0348140 A1* | 11/2019 | Cho | G11C 29/806 |
| 2020/0365226 A1* | 11/2020 | Ryu | G06F 13/4022 |
| 2021/0158888 A1* | 5/2021 | Wieduwilt | G11C 29/4401 |
| 2021/0349641 A1* | 11/2021 | Chiu | G06F 11/0793 |
| 2023/0005816 A1 | 1/2023 | Simsek-Ege | |
| 2023/0005854 A1 | 1/2023 | Simsek-Ege et al. | |
| 2023/0005855 A1 | 1/2023 | Simsek-Ege | |
| 2023/0005902 A1 | 1/2023 | Simsek-Ege et al. | |
| 2023/0005903 A1 | 1/2023 | Simsek-Ege et al. | |
| 2023/0005932 A1 | 1/2023 | Simsek-Ege et al. | |
| 2023/0005933 A1 | 1/2023 | Simsek-Ege | |
| 2023/0060512 A1 | 3/2023 | Simsek-Ege | |
| 2023/0178172 A1* | 6/2023 | Yun | G11C 29/846 714/719 |

OTHER PUBLICATIONS

He et al., "Microelectronic Devices Including Control Logic Circuitry Overlying Memory Arrays, and Related Memory Devices and Electronic Systems", Filed Mar. 18, 2022, U.S. Appl. No. 17/698,558, 44 pages.

He et al., "Fin Field Effect Transistor Sense Amplifier Circuitry and Related Apparatuses and Computing Systems", Filed Sep. 29, 2022, U.S. Appl. No. 17/936,760, 41 pages.

Simsek-Ege, "Methods of Forming Microelectronic Devices, and Related Microelectronic Devices and Electronic Systems", Filed Sep. 7, 2022, U.S. Appl. No. 17/930,388, 77 pages.

* cited by examiner

GLOBAL COLUMN REPAIR WITH LOCAL COLUMN DECODER CIRCUITRY, AND RELATED APPARATUSES, METHODS, AND COMPUTING SYSTEMS

TECHNICAL FIELD

This disclosure relates generally to global column repair with local column decoder circuitry, and more specifically to global match and latch circuitry used in conjunction with local column decoder circuitry that is local to column planes of a memory cell array.

BACKGROUND

A steady demand for ever smaller, higher density semiconductor devices has driven manufacturers of semiconductor devices to use smaller and smaller feature sizes for devices such as transistors and memory cells. Limitations on continued decreasing of feature sizes has led manufacturers of semiconductor devices to resort to three-dimensional (3D) device architectures and device stacking.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "assert," when used in the context of "asserting" a signal refers to driving the signal to a logic level that triggers an operation to be performed by a device that receives the signal. For example, a transistor may be triggered to electrically conduct from a source terminal to a drain terminal of the transistor responsive to an assertion of a signal provided to a gate terminal of the transistor (e.g., a logic level high or a "1" for NMOS transistors and a logic level low or a "0" for PMOS transistors). As another example, circuitry may be configured to be selectively enabled responsive to an assertion of an enable signal provided thereto. It should be noted that either a logic level high or a "1" or a logic level low or a "0" on a signal may be used as an assertion of the signal depending on how the circuitry is designed. Similarly, the term "de-assert," when used herein in the context of "de-asserting" a signal refers to driving the signal to a logic level that prevents an operation from being performed by a device that receives the signal.

Positioning control circuitry over an array of memory cells (e.g., a 3D array of DRAM memory cells) may decrease a chip area of a memory device as compared to a memory device with the control circuitry positioned laterally to the array. Examples of control circuitry that may be positioned over the array rather than lateral to the array to decrease chip area are column decoder circuitry and column select gates. Local column decoder circuitry may not, however, generally be efficient with emerging global column repair methods, which have certain advantages over local column repair methods. For example, including local column decoders with local match and latch circuits that communicate with a section to a global column repair plane may be relatively complicated and expensive. Specifically, it may be costly to duplicate match and latch circuits in every local column decoder circuitry while adding per-section horizontal routes to communicate with a global column plane.

In some embodiments, local column decoder circuitry may be used in conjunction with global match and latch circuits. These global match and latch circuits may provide column address CA and column select enable signals associated with local column decoder circuitry, which in turn are activated by section enable signals from a row decoder circuitry. If a global column repair is made, the global match and latch circuits may disable the repaired (defective) column plane and activate a column in a global column repair plane.

Local column decoder circuitry and local channel select gates that are local to column planes of memory cells according to various embodiments may be implemented on the same wafer as or a separate wafer from the memory cells. If separate, wafer bonding may be used to bond a control circuitry wafer including the local column decoder circuitry and local channel select gates, among other circuitry (e.g., sense amplifier circuitry, sub word driver circuitry) to an array wafer including the memory cells. By way of non-limiting example, the local column decoders may be positioned above each core and operate as local column decoders instead of as global column decoders. As a result, column select (CS) routes may be unique to each core.

The use of local column decoder circuitry that is local to column planes along with global match and latch circuitry may, compared to using fully local match and latch circuitry, be more array efficient because costly match and latch circuits do not have to be duplicated in every plane and horizontal local column decoder circuitry to global column repair plane routes may not be used. Also, global column repair may be more efficient and have a higher yield than local column repair schemes.

In some embodiments an apparatus includes a memory array, local column decoder circuitry, and global column repair circuitry. The memory array includes memory cells organized in column planes. The column planes are associated with respective column addresses. The local column decoder circuitry is local to each of the column planes. The local column decoder circuitry is configured to, if enabled, decode a received column address signal to generate a column select signal. The global column repair circuitry includes column address drivers, data storage elements, and match circuitry. The column address drivers correspond to respective ones of the column planes. The column address drivers are configured to, if enabled, drive the received column address signal to the local column decoder circuitry of respective ones of the column planes. The data storage elements are configured to store defective column addresses corresponding to defective column planes. The match circuitry is configured to compare a received column address indicated by the received column address signal to the defective column addresses, and disable a column address driver corresponding to a defective column plane responsive to a determination that the received column address matches a defective column address associated with the defective column plane.

In some embodiments an apparatus includes an array wafer and a control circuitry wafer bonded to the array wafer. The array wafer includes memory cells organized in column planes. The control circuitry wafer includes local column decoder circuitry, column address drivers, data storage elements, and match circuitry. The local column decoder circuitry is local to each of the column planes. The column address drivers correspond to respective ones of the column planes. The column address drivers are configured to, if enabled, drive a received column address signal to the local column decoder circuitry corresponding to the respective ones of the column planes. The data storage elements are configured to store defective column addresses. The match circuitry is configured to disable a column address driver corresponding to a defective column plane that corresponds to one of the defective column addresses responsive to a received column address indicated by the received column address signal matching the one of the defective column addresses.

In some embodiments a method of operating a memory device includes determining, by global column repair circuitry, whether a received column address indicated by a received column address signal matches a defective column address that corresponds to a known defective column plane. The method also includes disabling a column address driver corresponding to the known defective column plane responsive to a determination that the received column address matches the defective column address. The method further includes enabling a column address driver corresponding to a global column repair plane in place of the column address driver corresponding to the known defective column plane.

In some embodiments a computing system includes a memory device. The memory device includes an array of memory cells, local column decoder circuitry, column address drivers, data storage elements, and match circuitry. The array of memory cells includes column planes. The local column decoder circuitry is local to each of the column planes. The column address drivers correspond to respective column planes. The column address drivers are configured to, if enabled, drive a received column address signal to the local column decoder circuitry. The data storage elements are configured to store defective column addresses corresponding to defective ones of the column planes. The match circuitry is configured to disable a column address driver corresponding to a defective column plane responsive to a received column address indicated by the received column address signal matching one of the defective column addresses corresponding to the defective column plane.

Figure 1:
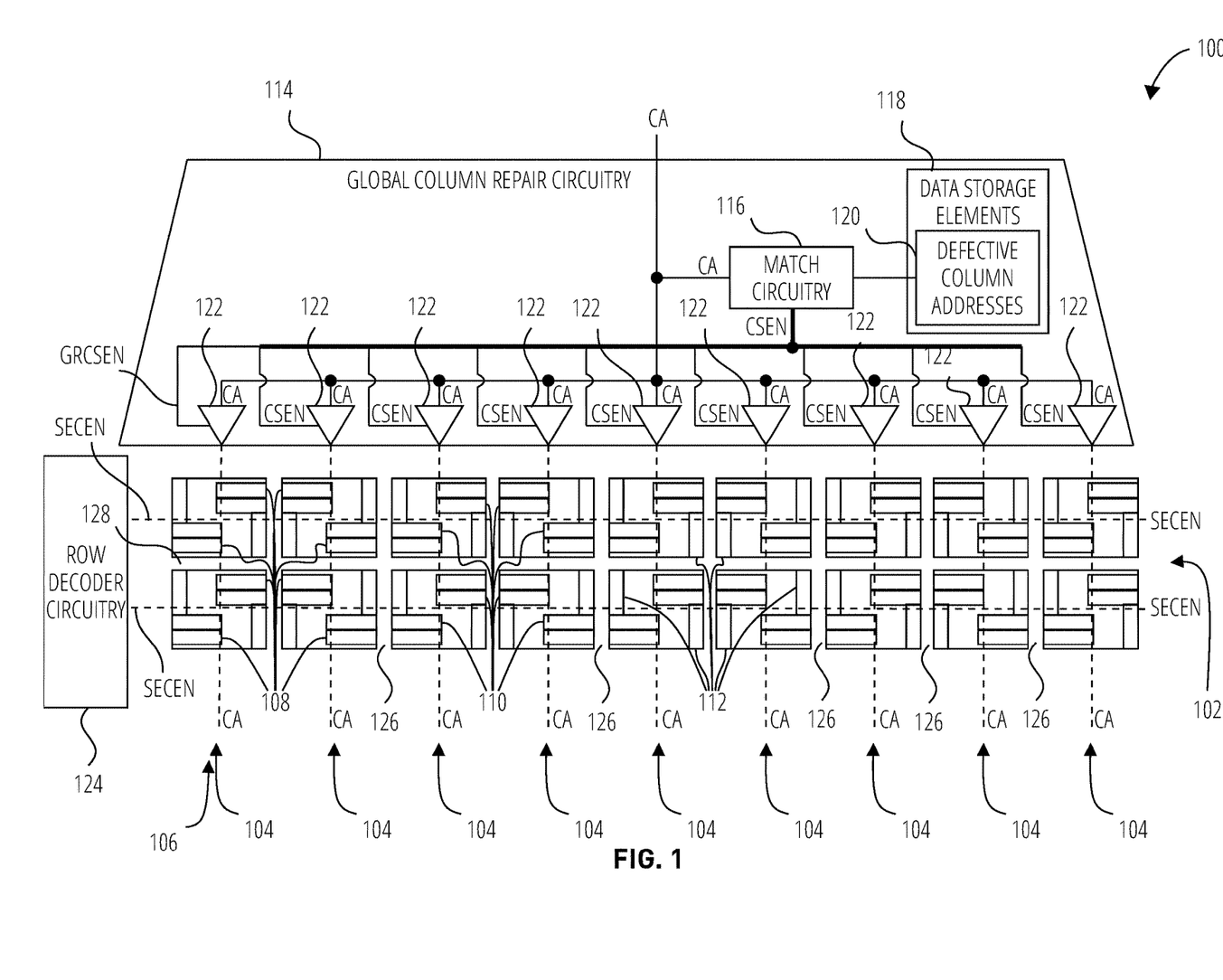
FIG. 1 is a simplified conceptual diagram of a memory device, according to some embodiments.

FIG. 1 is a simplified conceptual diagram of a memory device 100, according to some embodiments.

Figure 2:
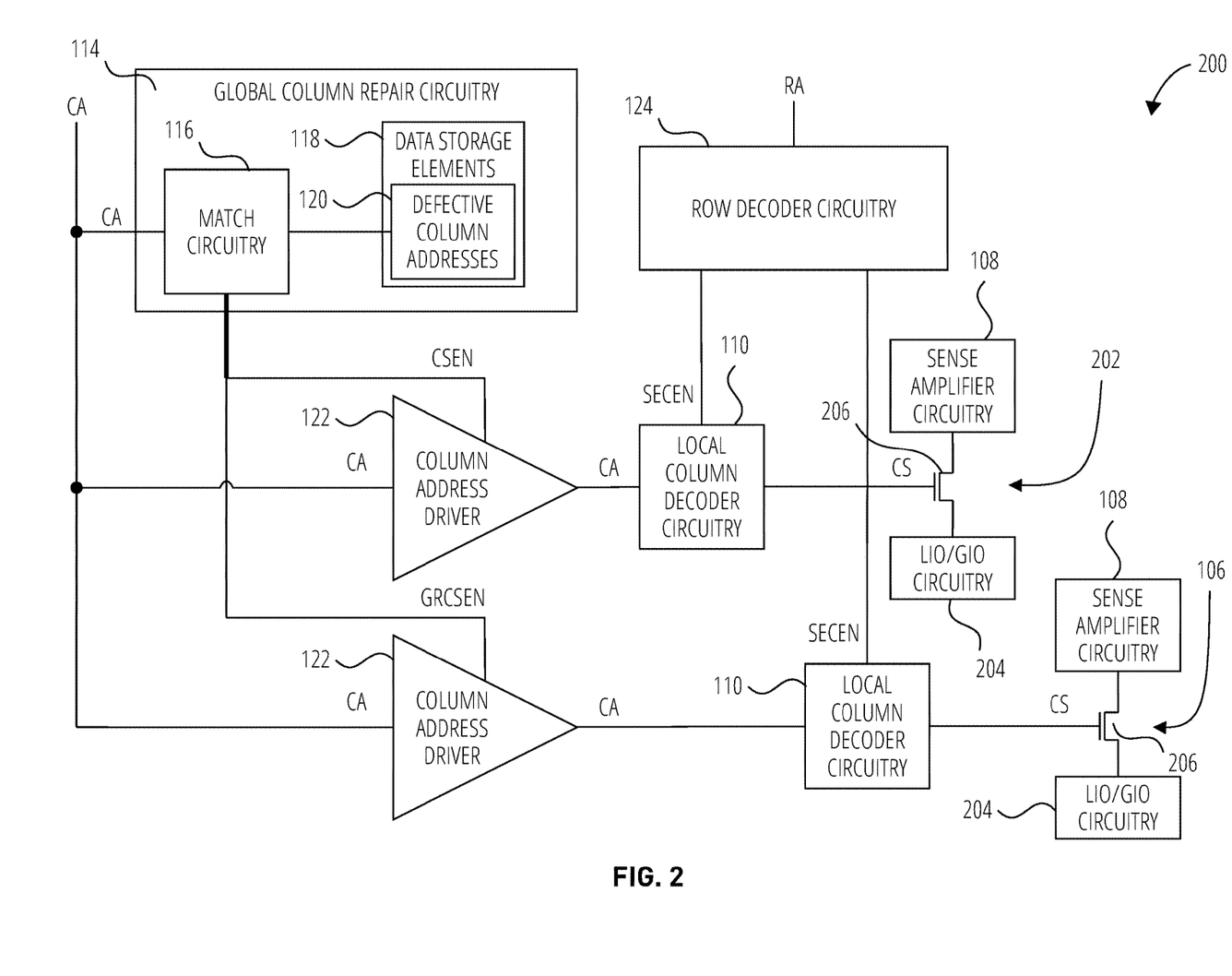
FIG. 2 is a block diagram of a portion 200 of the memory device 100 of FIG. 1.

FIG. 2 is a block diagram of a portion 200 of the memory device 100 of FIG. 1.

Referring to FIG. 1 and FIG. 2 together, the memory device 100 includes a memory array 102, global column repair circuitry 114, and row decoder circuitry 124. The memory array 102 includes memory cells organized in column planes 104. The column planes 104 are associated with respective column addresses. FIG. 1 illustrates word line sockets 126 between the column plane 104, and digit line sockets 128 between sections of the memory array 102. The memory device 100 also includes local column decoder circuitry 110, sense amplifier circuitry 108, sub word driver circuitry 112, and column select gates 206 that are local to each of the column planes 104. The local column decoder circuitry 110 is configured to, if enabled, decode a received column address signal CA to generate a column select signal CS.

The global column repair circuitry 114 includes column address drivers 122 corresponding to respective ones of the column planes 104. The column address drivers 122 are configurable to be enabled and disabled responsive to an assertion (e.g., a logic level high or a "1") and a de-assertion (e.g., a logic level low or a "0"), respectively, of a column select enable signal CSEN. The column address drivers 122 are configured to, if enabled, drive the received column address signal CA to the local column decoder circuitry 110 of respective ones of the defective column planes 202.

The global column repair circuitry 114 also includes data storage elements 118 (e.g., latch circuitry) and match circuitry 116 electrically connected to the data storage elements. The data storage elements 118 are configured to store defective column addresses 120 corresponding to defective column planes (e.g., defective column plane 202). The match circuitry 116 is configured to compare a received column address indicated by the received column address signal CA to the defective column addresses 120. The match circuitry 116 is also configured to disable a column address driver 122 corresponding to a defective column plane (e.g., the defective column plane 202) responsive to a determination that the received column address matches a defective column address associated with the defective column plane 202.

The match circuitry is further configured to enable a column address driver 122 corresponding to a global column repair plane 106 in place of the column address driver 122 corresponding to the defective column plane 202 responsive to the determination that the received column address matches the defective column address. Accordingly, a defective column plane 202 may be repaired by effectively disabling the defective column plane 202 and enabling the global column repair plane 106 in its place. The global column repair plane 106 may be used to repair any one of the column planes 104 if determined to be defective.

The row decoder circuitry 124 is configured to generate section enable signals SECEN responsive to a row address signal RA. The section enable signals SECEN are configured to control which portions of the local column decoder circuitry 110 are enabled. Accordingly, the column address drivers 122 drive the received column address signal to the local column decoder circuitry 110 in each column plane 104 that has an enabled column address driver 122. Only a portion of the local column decoder circuitry 110, however, that is activated by the section enable signals SECEN will decode the received column address signal CA to generate the column select signal CS.

As illustrated in FIG. 2, the column select gates 206, which are local to the column planes 104, include gate terminals that are electrically connected to the local column decoder circuitry 110. The column select gate 206 are electrically connected between the sense amplifier circuitry 108 and the LIO/GIO circuitry 204. Accordingly, the column select gates 206 are configured to selectively electrically connect and electrically isolate the sense amplifier circuitry 108 to and from the LIO/GIO circuitry 204 responsive to the column select signals CS.

Figure 3:
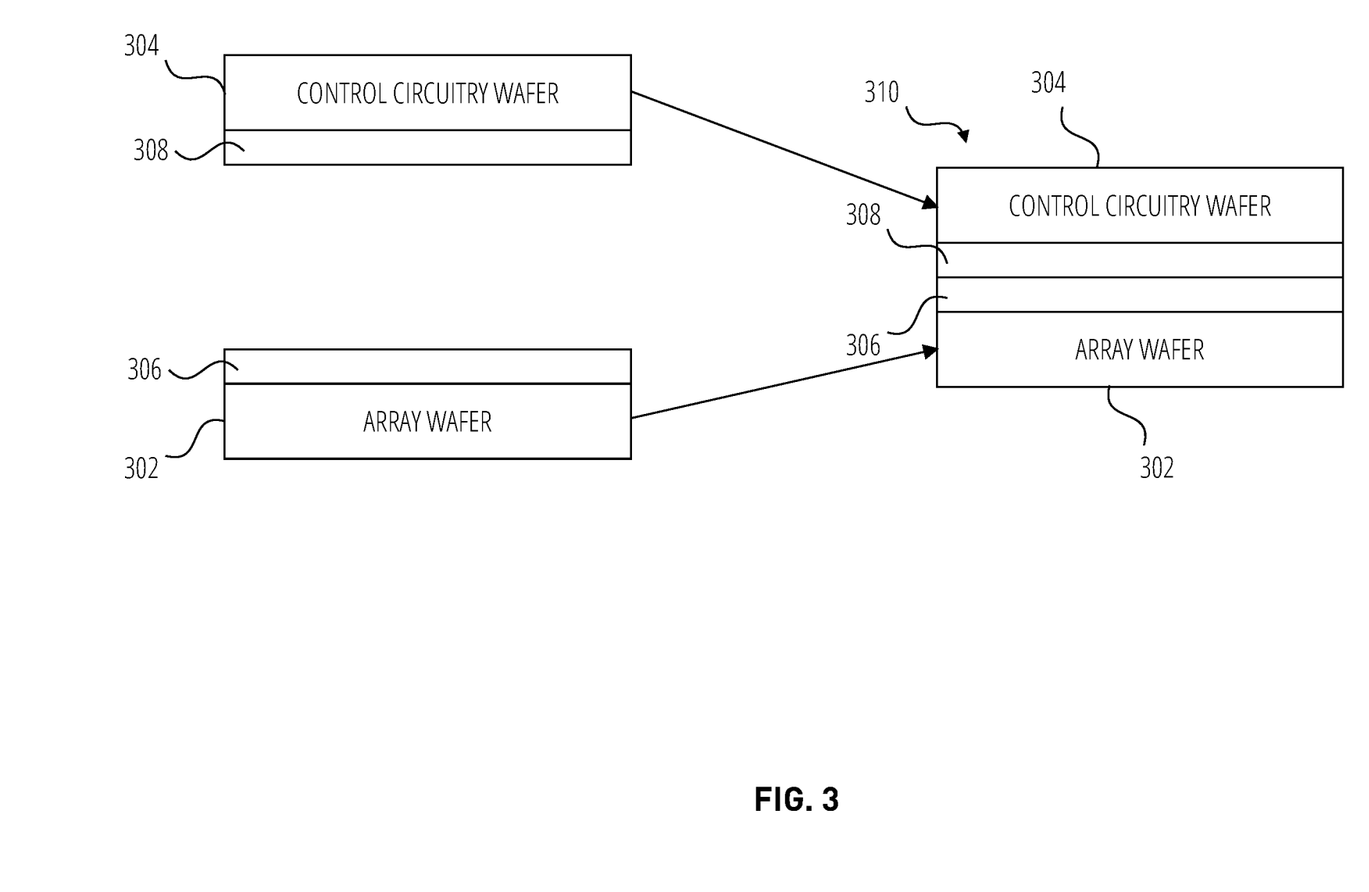
FIG. 3 is simplified conceptual diagram illustrating bonding of an array wafer to a control circuitry wafer to form a memory device, according to some embodiments.

FIG. 3 is simplified conceptual diagram illustrating bonding of an array wafer 302 to a control circuitry wafer 304 to form a memory device 310, according to some embodiments. The array wafer 302 includes a memory array 306 (e.g., the memory array 102 of FIG. 1) including memory cells (e.g., DRAM memory cells). The control circuitry wafer 304 includes control circuitry 308. By way of non-limiting example, the control circuitry wafer 304 may include the local column decoder circuitry 110, the sense amplifier circuitry 108, the sub word driver circuitry 112, the global column repair circuitry 114 (which includes the match circuitry 116, the data storage elements 118, and the column address drivers 122), and the row decoder circuitry 124 (FIG. 1). The sense amplifier circuitry 108 and the sub word driver circuitry 112 are local to the column planes 104. The array wafer 302 and the control circuitry wafer 304 may be manufactured separately using different processes, then bonded together to form the memory device 310.

According to various embodiments, a memory device includes an array wafer including memory cells organized in column planes and a control circuitry wafer bonded to the array wafer. The control circuitry wafer includes local column decoder circuitry, column address drivers, data storage elements, and match circuitry. The local column decoder circuitry is local to each of the column planes. The column address drivers correspond to respective ones of the column planes. The column address drivers are configured to, if enabled, drive a received column address signal to the local column decoder circuitry corresponding to the respective ones of the column planes. The data storage elements are configured to store defective column addresses. The match circuitry is configured to disable a column address driver corresponding to a defective column plane that corresponds one of the defective column addresses responsive to a received column address indicated by the received column address signal matching the one of the defective column addresses.

The match circuitry of the control circuitry 308 is also configured to enable a column address driver corresponding to a global column repair plane in place of the column address driver corresponding to the defective column plane. The local column decoder circuitry is configured to, if enabled, generate column select signals responsive to the received column address signal and provide the column select signals to column select gates that are local to the column planes. The column decoder circuitry is configured to be enabled responsive to section enable signals received from row decoder circuitry. The section enable signals are decoded from row address signals.

Figure 4:
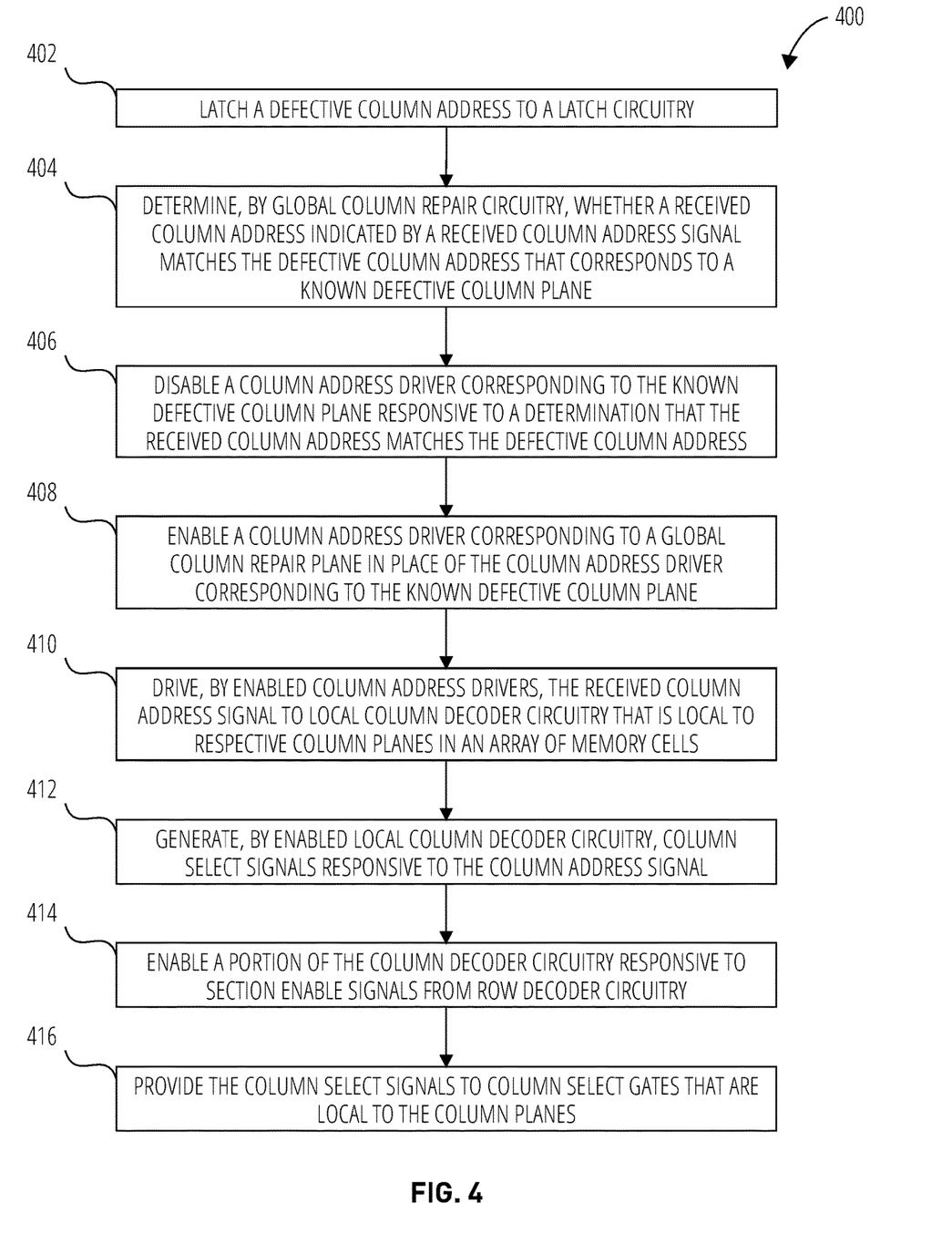
FIG. 4 is a flowchart illustrating a method of operating a memory device, according to some embodiments.

FIG. 4 is a flowchart illustrating a method 400 of operating a memory device (e.g., the memory device 100 of FIG. 1 or the memory device 310 of FIG. 3), according to some embodiments. At operation 402 the method 400 includes latching a defective column address to a latch circuitry (e.g., the data storage elements 118 of FIG. 1 and FIG. 2). At operation 404 the method 400 includes determining, by global column repair circuitry 114 (e.g., using the match circuitry 116 of FIG. 1), whether a received column address indicated by a received column address signal CA matches a defective column address that corresponds to a known defective column plane (e.g., the defective column plane 202 of FIG. 2).

At operation 406 the method 400 includes disabling a column address driver (e.g., a column address driver 122 of FIG. 1 and FIG. 2) corresponding to the known defective column plane responsive to a determination that the received column address matches the defective column address. In some embodiments disabling the column address driver corresponding to the known defective column plane includes de-asserting a column select enable signal CSEN provided to the column address driver that corresponds to the known defective column plane. At operation 408 the method 400 includes enabling a column address driver corresponding to a global column repair plane (e.g., the global column repair plane 106 of FIG. 1 and FIG. 2) in place of the column address driver corresponding to the known defective column plane (e.g., the known defective column plane 202 of FIG. 2). In some embodiments enabling the column address driver corresponding to the global column repair plane comprises asserting a column select enable signal CSEN provided to the column address driver corresponding to the global column repair plane.

At operation 410 the method 400 includes driving, by enabled column address drivers, the received column address signal to local column decoder circuitry (e.g., the local column decoder circuitry 110 of FIG. 1 and FIG. 2) that is local to respective column planes in an array of memory cells (e.g., memory array 102 of FIG. 1, which may be located in the array wafer 302 of FIG. 3). At operation 412 the method 400 includes generating, by enabled local column decoder circuitry, column select signals CS responsive to the column address signal CA.

At operation 414 the method 400 includes enabling a portion of the column decoder circuitry responsive to section enable signals SECEN from row decoder circuitry (e.g., the row decoder circuitry 124 of FIG. 1). At operation 416 the method 400 includes providing the column select signals CS to column select gates (e.g., the column select gate 206 of FIG. 2) that are local to the column planes.

Figure 5:
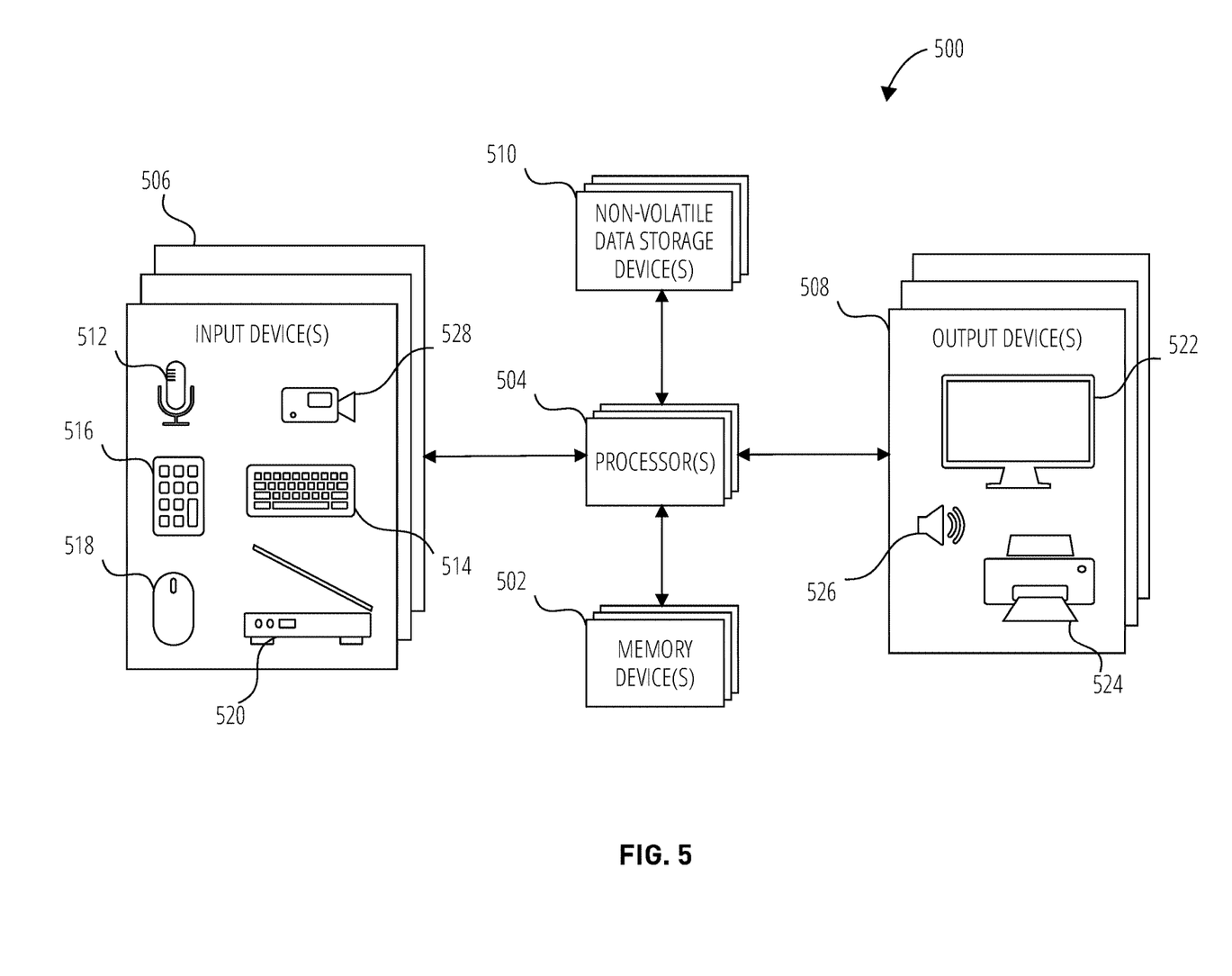
FIG. 5 is a block diagram of a computing system, according to some embodiments.

FIG. 5 is a block diagram of a computing system 500, according to some embodiments. The computing system 500 includes one or more processors 504 operably coupled to one or more memory devices 502, one or more non-volatile data storage devices 510, one or more input devices 506, and one or more output devices 508. In some embodiments the computing system 500 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 504 may include a central processing unit (CPU) or other processor configured to control the computing system 500. In some embodiments the one or more memory devices 502 include random access memory (RAM), such as volatile data storage (e.g., dynamic RAM (DRAM) such as 3D DRAM, static RAM (SRAM), etc.). In some embodiments the one or more non-volatile data storage devices 510 include a hard drive, a solid state drive, Flash memory, erasable programmable read only memory (EPROM), other non-volatile data storage devices, or any combination thereof. In some embodiments the one or more input devices 506 include a keyboard 514, a pointing device 518 (e.g., a mouse, a track pad, etc.), a microphone 512, a keypad 516, a scanner 520, a camera 528, other input devices, or any combination thereof. In some embodiments the output devices 508 include an electronic display 522, a speaker 526, a printer 524, other output devices, or any combination thereof.

In some embodiments the one or more memory devices 502 include the memory device 100 or the memory device 310 of FIG. 3. In some embodiments the memory devices 502 include an array of memory cells including column planes, local column decoder circuitry local to each of the column planes, column address drivers corresponding to respective column planes, data storage elements, and match circuitry. The column address drivers are configured to, if enabled, drive a received column address signal to the local column decoder circuitry. The data storage elements are configured to store defective column addresses corresponding to defective ones of the column planes. The match circuitry is configured to disable a column address driver corresponding to a defective column plane responsive to a received column address indicated by the received column address signal matching one of the defective column addresses corresponding to the defective column plane. The match circuitry is also configured to enable a column address driver corresponding to a global column repair plane in place of the column address driver corresponding to the defective column plane.

In some embodiments the memory devices 502 further include column select gates local to each of the column planes. In some embodiments the data storage elements include latch circuitry configured to latch the defective column addresses and make the defective column addresses available to the match circuitry.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C: A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc.," or "one or more of A, B, and C, etc.," is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
  a memory array including memory cells organized in column planes, the column planes associated with respective column addresses;
  local column decoder circuitry including all two or more local column decoder circuits, each local column decoder circuit of the two or more local column decoder circuits local to an associated column plane of the column planes, the local column decoder circuitry configured to, if enabled, decode a received column address signal to generate a column select signal; and
  global column repair circuitry coupled to each local column decoder circuit of the two or more local column decoder circuits, the global column repair circuitry comprising:
    column address drivers corresponding to respective ones of the column planes, the column address drivers configured to, if enabled, drive the received column address signal to the local column decoder circuitry of respective ones of the column planes;
    data storage elements configured to store known defective column addresses corresponding to defective column planes; and
    match circuitry coupled to each local column decoder circuit of the two or more local column decoder circuits, the match circuitry configured to:
      compare a received column address indicated by the received column address signal to the known defective column addresses; and
      disable a column address driver corresponding to a defective column plane responsive to a determination that the received column address matches a known defective column address associated with the defective column plane.

2. The apparatus of claim 1, wherein the match circuitry is further configured to enable a column address driver corresponding to a global column repair plane in place of the column address driver corresponding to the defective column plane responsive to the determination that the received column address matches the known defective column address.

3. The apparatus of claim 1, further comprising row decoder circuitry configured to generate section enable signals responsive to a row address signal, wherein the section enable signals are configured to control which portions of the local column decoder circuitry are enabled.

4. The apparatus of claim 1, wherein the data storage elements comprise latches.

5. The apparatus of claim 1, comprising an array wafer and a control circuitry wafer bonded to the array wafer, the array wafer including the memory array, the control circuitry wafer including the local column decoder circuitry and the global column repair circuitry.

6. The apparatus of claim 1, further comprising column select gates local to the column planes, gate terminals of the column select gates electrically connected to the local column decoder circuitry.

7. An apparatus, comprising:
  an array wafer including memory cells organized in column planes;
  a control circuitry wafer bonded to the array wafer, the control circuitry wafer including:
    local column decoder circuitry including two or more local column decoder circuits, each local column decoder circuit of the two or more local column decoder circuits local to an associated column plane of the column planes;
    column address drivers corresponding to respective ones of the column planes, the column address drivers configured to, if enabled, drive a received column address signal to the local column decoder circuitry corresponding to the respective ones of the column planes;
    data storage elements configured to store known defective column addresses; and match circuitry coupled to each local column decoder circuit of the two or more local column decoder circuits, the match circuitry configured to disable a column address driver corresponding to a defective column plane that corresponds to one of the known defective column addresses responsive to a received column address indicated by the received column address signal matching the one of the known defective column addresses.

8. The apparatus of claim 7, wherein the match circuitry is further configured to enable a column address driver corresponding to a global column repair plane in place of the column address driver corresponding to the defective column plane.

9. The apparatus of claim 7, wherein the local column decoder circuitry is configured to, if enabled, generate column select signals responsive to the received column address signal and provide the column select signals to column select gates that are local to the column planes.

10. The apparatus of claim 7, wherein the column decoder circuitry is configured to be enabled responsive to section enable signals received from row decoder circuitry.

11. The apparatus of claim 10, wherein the section enable signals are decoded from row address signals.

12. The apparatus of claim 7, wherein the control circuitry wafer further includes sense amplifier circuitry and sub-word driver circuitry that are local to the column planes.

13. A method of operating a memory device, the method comprising:
- determining, by global column repair circuitry that is coupled to a plurality of column planes, whether a received column address indicated by a received column address signal matches a defective column address that corresponds to a known defective column plane;
- disabling a column address driver corresponding to the known defective column plane responsive to a determination that the received column address matches the defective column address; and
- enabling a column address driver corresponding to a global column repair plane in place of the column address driver corresponding to the known defective column plane.

14. The method of claim 13, further comprising:
- driving, by enabled column address drivers, the received column address signal to local column decoder circuitry that is local to respective column planes in an array of memory cells; and
- generating, by enabled local column decoder circuitry, column select signals responsive to the column address signal.

15. The method of claim 14, further comprising enabling a portion of the column decoder circuitry responsive to section enable signals from row decoder circuitry.

16. The method of claim 14, further comprising providing the column select signals to column select gates that are local to the column planes.

17. The method of claim 13, further comprising latching the defective column address to a latch circuitry.

18. The method of claim 13, wherein disabling the column address driver corresponding to the known defective column plane comprises de-asserting a column select enable signal provided to the column address driver that corresponds to the known defective column plane.

19. The method of claim 13, wherein enabling the column address driver corresponding to the global column repair plane comprises asserting a column select enable signal provided to the column address driver corresponding to the global column repair plane.

20. A computing system, comprising:
a memory device including:
- an array of memory cells including column planes;
- local column decoder circuitry including a plurality of local column decoder circuits, each local column decoder circuit of the plurality of local column decoder circuits local to an associated column plane of the column planes;
- column address drivers corresponding to respective column planes, the column address drivers configured to, if enabled, drive a received column address signal to the local column decoder circuitry;
- data storage elements configured to store known defective column addresses corresponding to defective ones of the column planes; and
- match circuitry coupled to each local column decoder circuit of the plurality of local column decoder circuits, the match circuitry configured to disable a column address driver corresponding to a defective column plane responsive to a received column address indicated by the received column address signal matching one of the known defective column addresses corresponding to the defective column plane.

21. The computing system of claim 20, wherein the memory device further includes column select gates local to each of the column planes.

22. The computing system of claim 20, wherein the data storage elements include latch circuitry configured to latch the known defective column addresses and make the known defective column addresses available to the match circuitry.

23. The computing system of claim 20, wherein the match circuitry is further configured to enable a column address driver corresponding to a global column repair plane in place of the column address driver corresponding to the defective column plane.

24. The computing system of claim 20, further comprising:
- one or more processors electrically connected to the memory device;
- one or more non-volatile data storage devices electrically connected to the one or more processors;
- one or more input devices electrically connected to the one or more processors; and
- one or more output devices electrically connected to the one or more processors.

* * * * *

UNITED STATES PATENT AND TRADEMARK OFFICE
CERTIFICATE OF CORRECTION

Page 1 of 1

PATENT NO. : 12,242,346 B2
APPLICATION NO. : 17/937924
DATED : March 4, 2025
INVENTOR(S) : Christopher G. Wieduwilt and Fatma Arzum Simsek-Ege It is certified that error appears in the above-identified patent and that said Letters Patent is hereby corrected as shown below:

In the Specification
  Column 9,  Lines 3-4,  change "such as A, B, and C: A, B, and D;"
                  to --such as A, B, and C; A, B, and D;--

In the Claims
Claim 1,  Column 9,  Line 64,  change "including all two or more" to
                  --including two or more--

Signed and Sealed this
Twentieth Day of May, 2025

Coke Morgan Stewart
*Acting Director of the United States Patent and Trademark Office*